(12) United States Patent
Takasu et al.

(10) Patent No.: US 6,369,409 B1
(45) Date of Patent: Apr. 9, 2002

(54) SEMICONDUCTOR DEVICE AND METHOD OF MANUFACTURING THE SAME

(75) Inventors: Hiroaki Takasu; Jun Osanai; Kenji Kitamura, all of Chiba (JP)

(73) Assignee: Seiko Instruments Inc., Chiba (JP)

( * ) Notice: Subject to any disclaimer, the term of this patent is extended or adjusted under 35 U.S.C. 154(b) by 711 days.

(21) Appl. No.: 08/689,867

(22) Filed: Aug. 15, 1996

(30) Foreign Application Priority Data

| Aug. 24, 1995 | (JP) | 7-215617 |
| Aug. 24, 1995 | (JP) | 7-215618 |
| Dec. 28, 1995 | (JP) | 7-343018 |
| Mar. 25, 1996 | (JP) | 8-068639 |
| Aug. 6, 1996 | (JP) | 8-207302 |

(51) Int. Cl.$^7$ ............................................. F02K 9/00
(52) U.S. Cl. ......................... 257/60; 257/60; 257/538; 257/379
(58) Field of Search ................... 257/60, 538, 379

(56) References Cited

U.S. PATENT DOCUMENTS

| 3,755,722 A | * | 8/1973 | Harland, Jr. | 257/538 |
| 5,296,726 A | * | 3/1994 | Mac Elwee | 257/538 |
| 5,428,242 A | * | 6/1995 | Furuya | 257/538 |
| 5,490,106 A | * | 2/1996 | Tasaka | 257/60 |
| 5,543,652 A | * | 8/1996 | Ikeda | 257/379 |

OTHER PUBLICATIONS

Meade et al, *Intro. to VLSI Systems* pp. 5–6, ©1980.*

* cited by examiner

*Primary Examiner*—Stephen D. Meier
(74) *Attorney, Agent, or Firm*—Hogan & Hartson, L.L.P.

(57) ABSTRACT

It is an object to provide a highly precise bleeder resistance circuit having an accurate voltage division ratio and a small temperature coefficient of the resistance value and a highly precise semiconductor device having a small temperature coefficient using such a bleeder resistance circuit, e.g., a semiconductor device such as a voltage detector and a voltage regulator. Such characteristic features that the potential of electric conductors on the thin film resistors and electric conductors under the thin film resistors of a bleeder resistance circuit using thin film resistors is made almost equal to the potential of respective thin film resistors and that, when polysilicon is used in the thin film resistor, the dispersion of the resistance value is controlled and the temperature dependency of the resistance value is made lower by thinning the film thickness of the polysilicon thin film resistor are constituted.

24 Claims, 12 Drawing Sheets

SEMICONDUCTOR DEVICE AND METHOD OF MANUFACTURING THE SAME

BACKGROUND OF THE INVENTION

The present invention relates to a semiconductor device, and in particular to a semiconductor device having a bleeder resistance circuit using thin film resistors and a method of manufacturing the same.

Although a bleeder resistance circuit using a thin film resistor has been widely used, no attention has been paid to wiring on thin film resistors and potentials of electric conductors at lower portion of the thin film resistor, but those in the field are aware that various arrangements are made have been known. Further, polysilicon is used frequently as a thin film resistor material, but that in which, when a MOS transistor is consolidated in the same chip, the film thickness is made equal to the film thickness of a gate electrode of the MOS transistor has been known.

In a conventional bleeder resistance circuit using a thin film resistor, however, there is a known a problem that a voltage division ratio becomes inaccurate frequently. Further, in a conventional bleeder resistance circuit coordinating a MOS transistor in the same chip, there has been such a problem that a resistance value change due to the temperature of a polysilicon thin film resistor (temperature coefficient of a resistance value) being large in a region of high sheet resistance value at 1 kilo-ohm/□ or higher, and the sheet resistance value has to be set small in order to obtain high voltage division accuracy in a wide temperature range, and thus, the area occupied by the bleeder circuit region requiring a high resistance value at one meg-ohm or higher becomes larger.

It is an object of the present invention to solve the above-mentioned subjects, and provide a bleeder resistance circuit of high accuracy having an accurate voltage division ratio and a small temperature coefficient of a resistance value and a semiconductor device of high accuracy having a small temperature coefficient using such a bleeder resistance circuit, e.g., a semiconductor device such as a voltage detector and a voltage regulator.

SUMMARY OF THE INVENTION

The first means adopted for the purpose of achieving the above-mentioned object in a semiconductor device of the present invention is characterized in that the potential of the wiring on a thin film resistor and an electric conductor in the lower part of the thin film resistor in a bleeder resistance circuit using thin film resistors is made almost equal to the potential of respective resistors. This is based on that such a fact that the resistance value of the thin film resistor is changed by the potential of the wiring on the bleeder resistance circuit using thin film resistors (in particular polysilicon thin film resistors) and the electric conductor in the lower part thereof has become clear through experiments by the present inventor.

The second means adopted for the purpose of achieving the above-mentioned object in a semiconductor device of the present invention is characterized in that a polysilicon thin film resistor of a bleeder resistance circuit is made to have a film thickness thinner than a gate electrode of a MOS transistor coordinated in the same chip. This is based on that such a fact that dispersion of the resistance value becomes smaller and temperature dependency of the resistance value becomes lower even at the same sheet resistance as the film thickness of the thin film resistor (in particular polysilicon thin film resistor) gets thinner has become clear through experiments by the present inventor.

According to the semiconductor device of the present invention, it is possible to realize a bleeder resistance circuit of high accuracy having a more accurate voltage division ratio by making the potential of the wiring on the thin film resistor and the electric conductor in the lower part of the thin film resistor of the bleeder resistance circuit using the thin film resistors almost equal to the potential of respective resistors. In particular, when polysilicon is used in the thin film resistors, in the semiconductor device of the present invention, it is possible to control the dispersion of the resistance value and make temperature dependency of the resistance value smaller by making the film thickness of the polysilicon thin film resistor of the bleeder resistance circuit thinner.

It is possible to obtain a semiconductor device of high accuracy having a small temperature coefficient, e.g., a semiconductor device such as a voltage detector and a voltage regulator using such a bleeder resistance circuit.

DETAILED DESCRIPTION

Preferred embodiments of the present invention will be described hereinafter with reference to the drawings.

Figure 1:
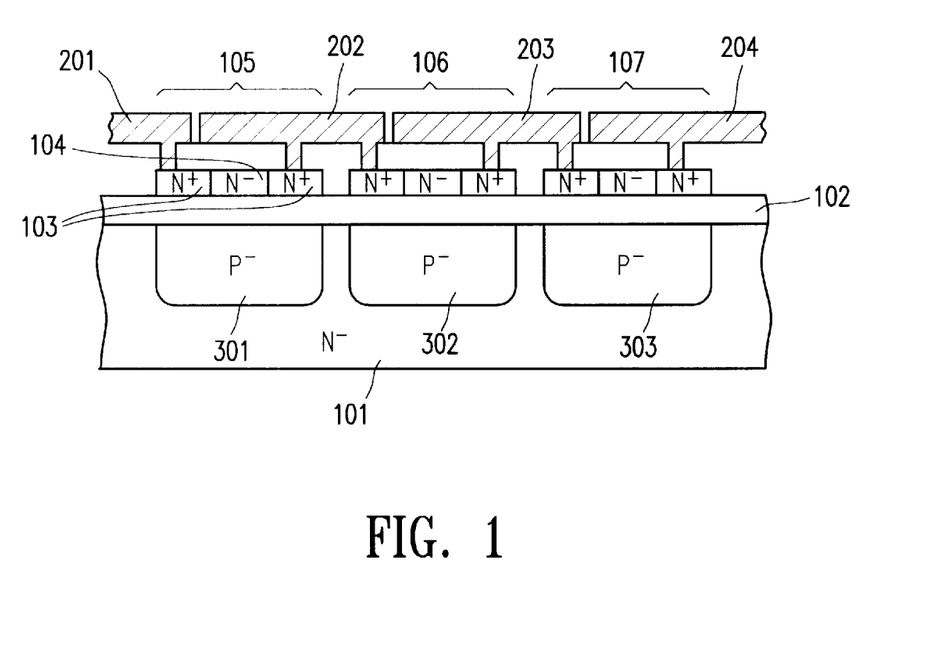
FIG. 1 is a typical sectional view showing an embodiment of a bleeder resistance circuit region of a semiconductor device according to the present invention.

FIG. 1 is a typical sectional view showing an embodiment of the bleeder resistance circuit region of a semiconductor device according to the present invention.

Split P-well regions 301, 302 and 303 are formed in a silicon semiconductor substrate 101 having a thin N-type impurity concentration. A silicon oxide film 102 is formed on the silicon semiconductor substrate 101, and polysilicon resistors 105, 106 and 107 each having a high resistance region 104 put between thick N-type impurity regions 103 for making contact with wiring are formed on the silicon oxide film 102. Further, wiring 201, 202, 203 and 204 composed of aluminum, respectively, are connected to the thick N-type impurity regions. Here, although it is not illustrated, the well region 301 is connected electrically to the wiring 202, the well region 302 to the wiring 203 and the well region 303 to the wiring 204, thus forming the same potential therebetween. Therefore, the potential of the high resistance region 104 of the polysilicon resistor 105, the potential of the wiring 202 located thereabove and the potential of the well region 301 located in the lower part are almost equal to one another. The same is applied to the relationship of potentials among the polysilicon resistors 106 and 107, the wiring 106 and 107 located thereabove and the well regions 302 and 303 arranged thereunder. By making the potentials of respective polysilicon resistors themselves and the wiring and the well regions located above the under thereof equal to one another, the resistance values of respective polysilicon resistors 105, 106 and 107 are held correctly. Besides, when it is desired to form the silicon oxide film 102 thinly, it is possible to maintain insulation performance between the silicon semiconductor substrate 101 and the polysilicon resistors 105, 106 and 107 high by using a composite film having a silicon nitride film in place of the silicon oxide film 102. Further, the conduction type of the silicon semiconductor substrate 101 may also be P-type, and the well regions 301, 302 and 303 are made to be of N-type in that case. It is desirable that the impurity concentration of the well regions 301, 302 and 303 is at approximately 1E16 atoms/cm$^3$ or higher at the surface of the silicon semiconductor substrate 101 from a viewpoint of preventing depletion in the silicon semiconductor substrate 101, and a thick impurity concentration may be provided even if it is a well region. The quantity of polysilicon resistors is not limited, but may be set in accordance with the number of voltage division pieces required for the bleeder resistance circuit. Further, although it is not illustrated, when it is difficult to split the well region with respect to every resistor and arrange them, it is recommended to bring the well regions 301, 302 and 303 together with respect to every several resistors or to form them en bloc without splitting in order to give the highest priority to high integration of the bleeder resistance circuit. Although the voltage division accuracy is more or less sacrificed at this time, this may be said to be the second best policy of the embodiment shown in FIG. 1. Further, it has been described with reference to FIG. 1 that the silicon semiconductor substrate 101 is of an N-type and the well regions 301, 302 and 303 are of a P-type, but it is indifferent to form the silicon semiconductor substrate 101 to show the P-type and the well regions 301, 302 and 303 to show the N-type.

Figure 2:
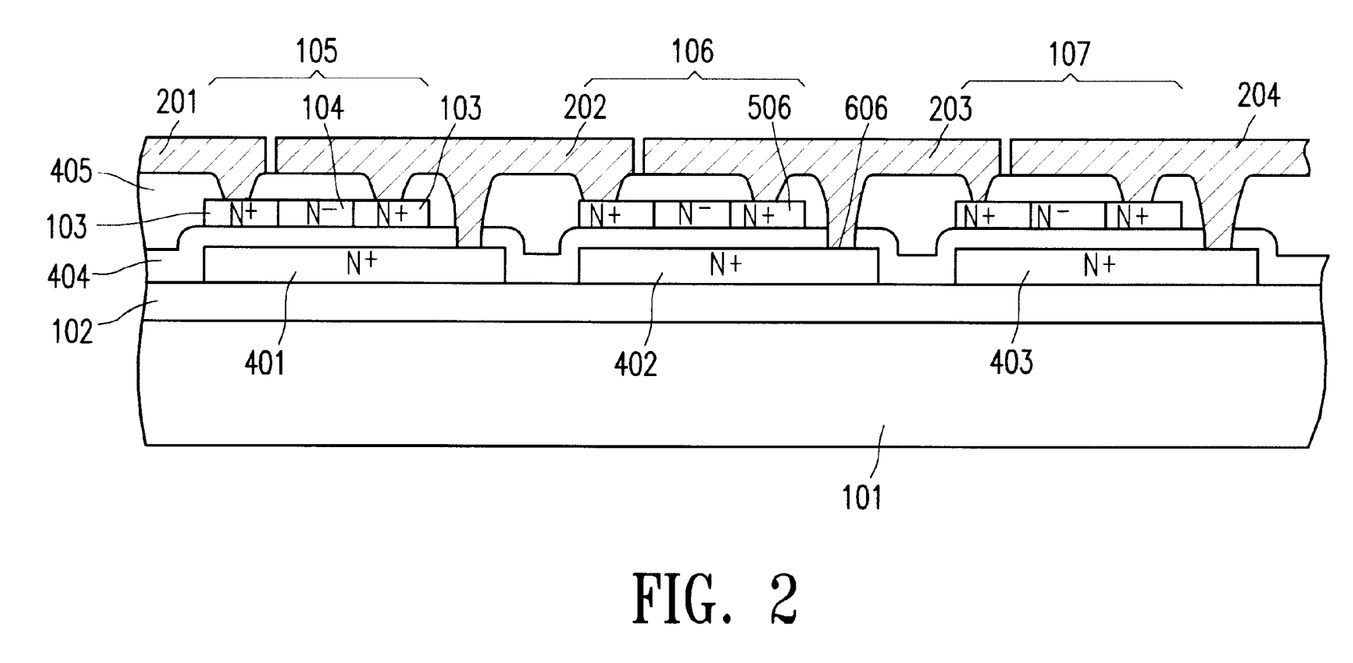
FIG. 2 is a typical sectional view showing another embodiment of a bleeder resistance circuit region of a semiconductor device according to the present invention.

FIG. 2 is a typical sectional view showing another embodiment of a bleeder resistance circuit region of a semiconductor device according to the present invention. A silicon oxide film 102 is formed on a silicon semiconductor substrate 101, and thick N-type polysilicon thin films 401, 402 and 403 are formed on the silicon oxide film 102. Polysilicon resistors 105, 106 and 107 each having a high resistance region 104 put between thick N-type impurity regions 103 for making contact with wiring through a first insulating film 404 composed of a silicon oxide film or the like are formed on the thick N-type polysilicon thin films 401, 402 and 403. Further, aluminum wiring 201, 202 and 203 are formed on the polysilicon resistors 105, 106 and 107 through a second insulating film 405 composed of a silicon oxide film or the like, and are connected to the thick N-type impurity regions 103 of the polysilicon resistors 105, 106 and 107 and the thick N-type polysilicon thin films 401, 402 and 403 through contact holes 506 and 606, respectively. Thus, the potential of the high resistance region 104 of the polysilicon resistor 105, the potential of the wiring 202 located thereabove and the potential of the thick N-type polysilicon thin film 401 located thereunder are in a state that they are almost equal to one another. The same is applied to the relationship among potentials of the polysilicon resistors 106 and 107, wiring 203 and 204 arranged thereabove and the thick N-type polysilicon thin films 402 and 403 arranged thereunder. The resistance values of respective polysilicon resistors 105, 106 and 107 are held correctly by making the potentials of respective polysilicon resistors themselves, and wiring and thick N-type polysilicon thin films located above and under thereof equal to one another as described above. Besides, although it is not illustrated, when the MOS transistor is formed on the same chip as the bleeder resistance circuit, it is possible to aim at simplification of the manufacturing process by forming a gate electrode of the same film as the thick N-type polysilicon thin films 401, 402 and 403. Further, it is also effective to form both or one of a first insulating film 404 and a second insulating film 405 as a composite film having a silicon nitride film from a viewpoint of reliability as described in the example shown in FIG. 1. Further, the quantity of polysilicon resistors is not limited, but may be set in accordance with the number of voltage division pieces required for the bleeder resistance circuit.

Figure 3:
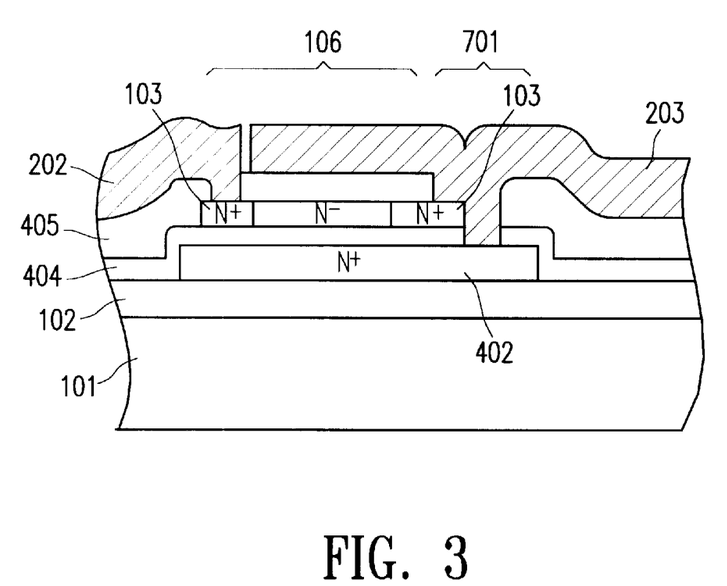
FIG. 3 is a typical sectional view showing an embodiment with a part of a bleeder resistance circuit region of a semiconductor device according to the present invention magnified.

FIG. 3 is a typical sectional view showing an embodiment in which a part of a bleeder resistance circuit region of a semiconductor device according to the present invention is magnified.

What differs from the example shown in FIG. 2 is the fact that an aluminum wiring 203, a thick N-type impurity region 103 of a polysilicon resistor 106 and a thick N-type polysilicon thin film 402 that are desired to be at the same potential are connected through one contact hole 701. With this, it is possible to reduce the area occupied by the contact hole forming region, thus producing an effect in reduction of area of the whole bleeder resistance circuit region. The same reference numerals as those in FIG. 2 are affixed to other parts, which will be substituted for description.

Figure 4:
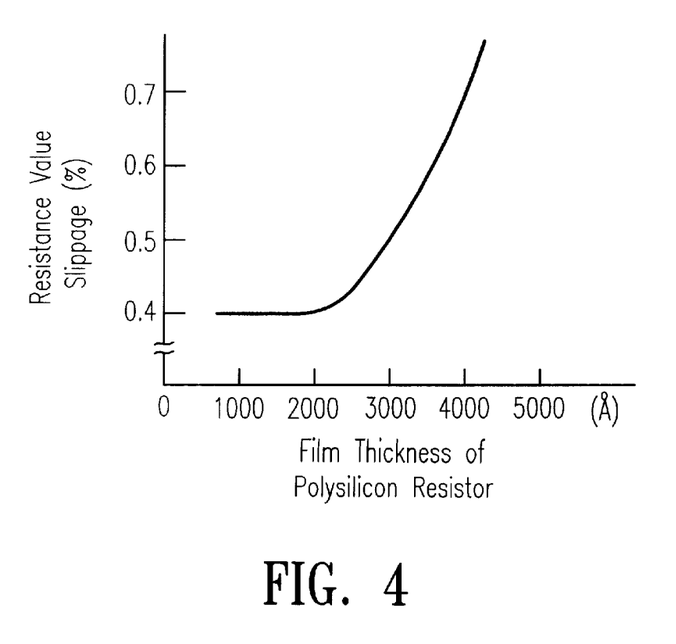
FIG. 4 is a diagram showing the relationship between the slippage of the resistance value of the polysilicon resistor and the film thickness of the polysilicon resistor when potential of 5 volts is applied to aluminum wiring above the polysilicon resistor having sheet resistance of 10 kilo-ohm.

FIG. 4 is a diagram showing the relationship between slippage (dispersion) of the resistance value of the polysilicon resistor and the film thickness of the polysilicon resistor when the potential of 0 volt to 5 volts is applied to the aluminum wiring above the polysilicon resistor having sheet resistance of 10 kilo-ohm.

As it is apparent from FIG. 4, it becomes more difficult to be subject to the influence by the potential of the wiring as the film thickness of the polysilicon resistor gets thinner. In particular, it is possible to control dispersion of the resistance value by setting the film thickness of the polysilicon resistor to approximately 10 to 20,000 Å. In order to form the polysilicon resistor with a uniform continuous film, it is desirable to set the film thickness to approximately 100 Å or more by the present manufacturing method (CVD method or the like). When a discontinuous film is produced, dispersion is generated in the resistance value on the contrary.

Figure 5:
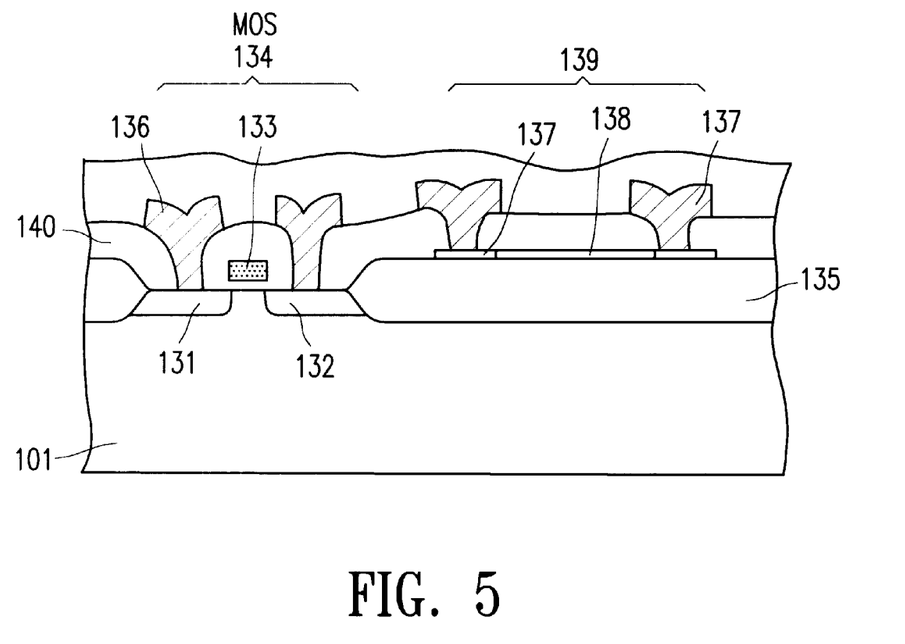
FIG. 5 is a typical sectional view showing another embodiment of a semiconductor device according to the present invention.

FIG. 5 is a typical sectional view showing another embodiment of a semiconductor device according to the present invention.

A MOS transistor 134 having a pair of source region 131, drain region 132 and a polysilicon gate electrode 133 is formed on a silicon semiconductor substrate 101. On the other hand, a polysilicon thin film resistor 139 having a high resistance region 138 put between impurity regions 137 of high concentration for making contact with aluminum wiring 136 is formed on a field oxide film 135. Although only one polysilicon thin film resistor is shown in FIG. 5 for the sake of simplicity, the practical bleeder resistance circuit region is formed of a plurality of polysilicon thin film resistors.

In FIG. 5, the polysilicon gate electrode 133 of the MOS transistor 134 and the polysilicon thin film resistor 139 have different film thickness, and the polysilicon thin film resistor 139 is formed to have thinner film thickness. For example, the film thickness of the polysilicon gate electrode 133 is set to 4,000 angstrom, and the film thickness of the polysilicon thin film resistor 139 is set to 1,000 angstrom. The polysilicon gate electrode 133 is required to fulfill the duties of wiring in a part, and is desirable to have the lowest possible sheet resistance. In contract with this, the highest possible and accurate sheet resistance value and the small temperature coefficient of the resistance value are demanded for the polysilicon thin film resistor 139. Therefore, it becomes natural and effective means to change the film thickness of the polysilicon gate electrode 133 of the MOS transistor 134 and the polysilicon thin film resistor 139 conforming to the object. Here, it is simple and very effective to thin the film thickness as a method of making the temperature coefficient of the resistance value of the polysilicon thin film resistor 139 smaller. This fact will be explained hereinafter based on experimental data by the inventor.

Figure 6:
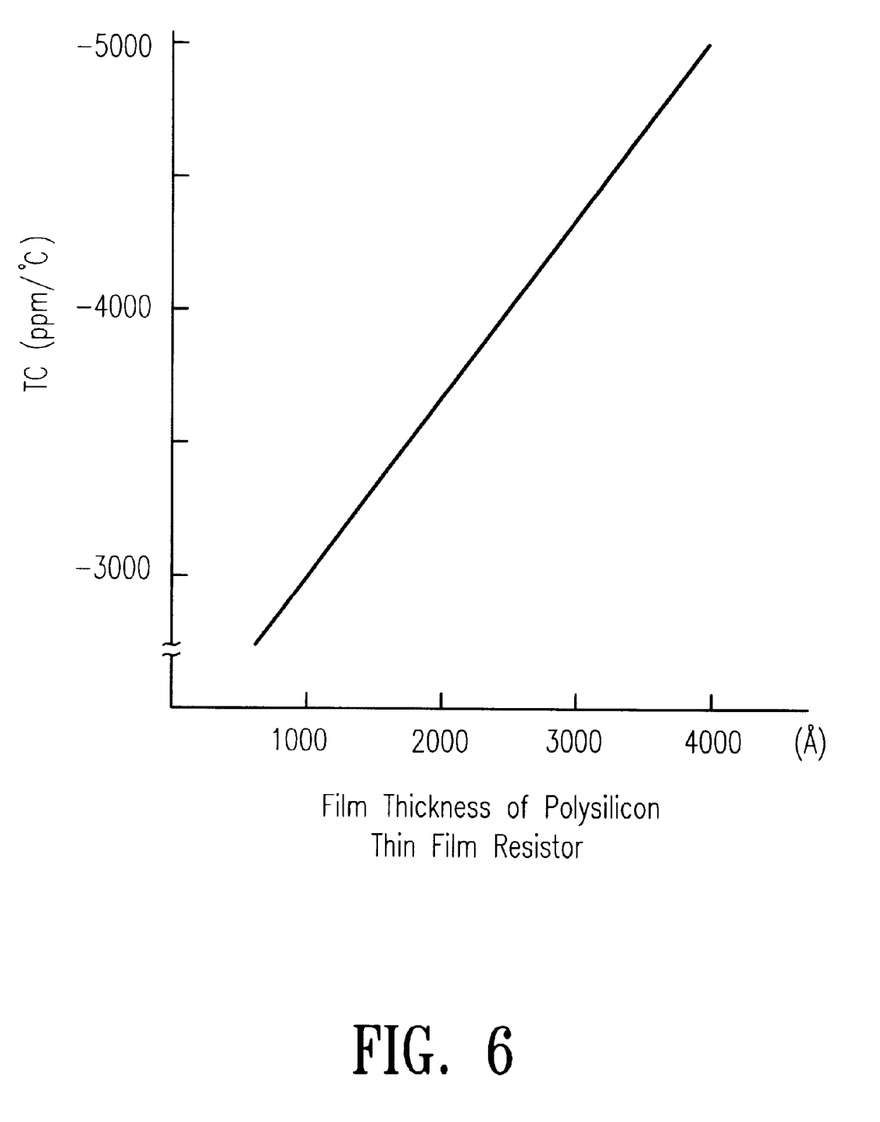
FIG. 6 is a diagram showing the relationship between the temperature coefficient (TC) of the resistance value of a polysilicon thin film resistor having sheet resistance of 10 kilo-ohm for a bleeder resistance circuit and the film thickness of the polysilicon thin film resistor.

FIG. 6 is a diagram showing the relationship between the temperature coefficient (TC) of the resistance value of the polysilicon thin film having sheet resistance of 10 kilo-ohm for the bleeder resistance circuit and the film thickness of the polysilicon thin film resistor.

It is understood that the temperature coefficient (TC) of the resistance value of the polysilicon thin film resistor can be reduced remarkably by thinning the film thickness of the polysilicon thin film resistor. In particular, it is possible to make the TC very small to −3,000 ppm/° C. or lower in the film thickness of 1,000 angstrom or less.

FIG. 6 shows an example with respect to a polysilicon thin film resistor having sheet resistance of 10 kilo-ohm, but it has been clarified according to experiments by the present inventor that the temperature coefficient (TC) of the resistance value of the polysilicon thin film resistor can be lowered by thinning the film thickness of the polysilicon thin film resistor at least within the range of sheet resistance of 1 to 500 kilo-ohm.

Figure 7:
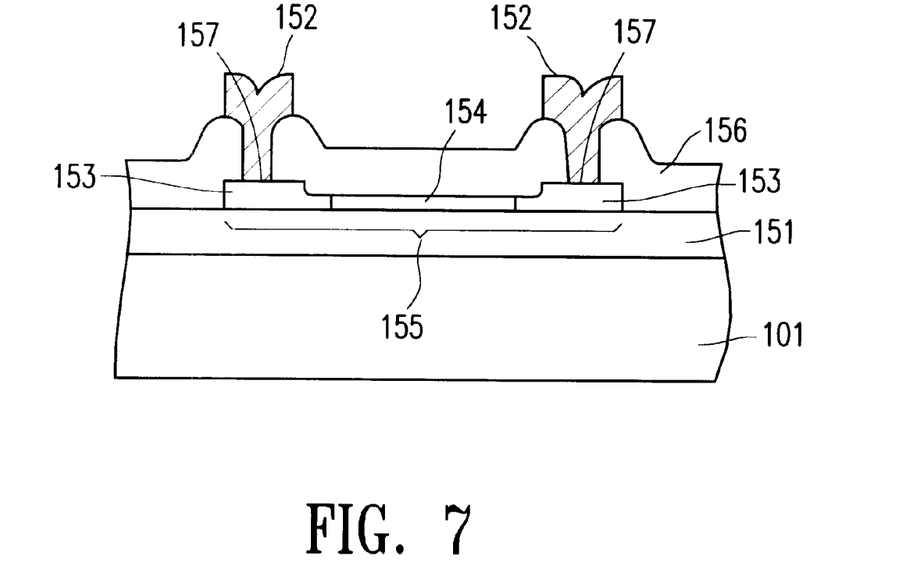
FIG. 7 is a typical sectional view showing another embodiment of a semiconductor device according to the present invention.

FIG. 7 is a typical sectional view showing another embodiment of a semiconductor device according to the present invention.

A first insulating film 151 composed of silicon dioxide or the like is formed on a silicon semiconductor substrate 101. A polysilicon thin film resistor 155 having a high resistance region 154 put between low resistance regions 153 having high impurity concentration for making contact with metal wiring such as aluminum is formed on the flat face of the first insulating film 151. A second insulating film 156 composed of PSG, BPSG or the like is formed on the polysilicon thin film resistor 155 and the first insulating film 151, and contact holes 157 are provided in the second insulating film 156 so that the metal wiring 152 and low resistance regions 153 having high impurity concentration are connected electrically therethrough. Here, the film thickness of the high resistance region 154 in the polysilicon thin film resistor 155 is made thinner than the low resistance region 153. A high sheet resistance value is obtained by thinning the film thickness of the high resistance region 154, and a small temperature coefficient is secured while reducing the occupied area. On the other hand, the low resistance region 153 has been formed thick so that no penetration through the polysilicon layer is produced at time of forming contact holes 157 for connecting with the metal wiring 152. In the experiments by the present inventor, it has been found that the temperature coefficient of the resistance value can be made extremely small to −3,000 ppm/° C. or lower by setting the film thickness of the high resistance region 154 to 1,000 angstrom or less in the case of a sheet resistance value of approximately 10 kilo-ohm/□. Further, in a recent IC process, the contact holes are generally formed by dry etching for refinement. When the contact holes 157 are formed in the second insulating film 156, overetching is made so that no etching remainder is produced, but the low resistance region 153 in the polysilicon thin film resistor 155 is also etched in the interim. Therefore, penetration of the contact holes 157 has been prevented by making the film thickness of the low resistance region 153 thicker. When the second insulating film 156 is formed of PSG or BPSG and the film thickness thereof is one micron or less, penetration could be prevented when the film thickness of the low resistance region 153 was approximately 2,000 angstrom or more.

Figure 8:
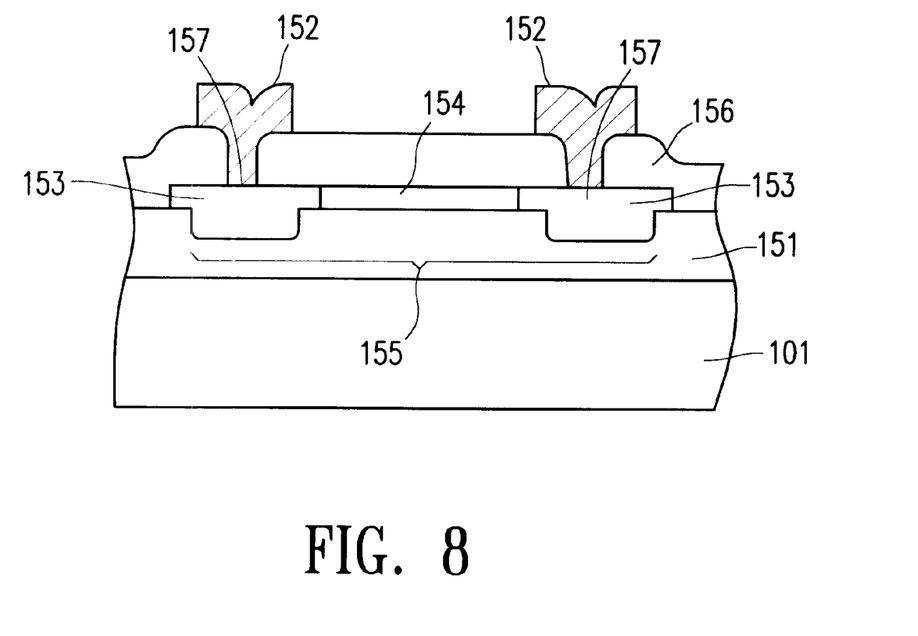
FIG. 8 is a typical sectional view showing another embodiment of a semiconductor device according to the present invention.

FIG. 8 is a typical sectional view showing another embodiment of a semiconductor device according to the present invention.

What differs from the example shown in FIG. 7 is the fact that the film thickness of the first insulating film 151 differs partially, the low resistance region 153 of the polysilicon thin film resistor 155 is formed on the region having thin film thickness, the high resistance region 154 is formed on the region having thick film thickness, and surfaces of the low resistance region 153 and the high resistance region 154 form almost flat same face. With this, since it is possible to form the high resistance region 154 thin, and on the other hand, to form the low resistance region 153 thick, the effect described in the example shown in FIG. 7 is obtainable. The description on other parts is substituted for affixing the same reference numerals as those shown in FIG. 7.

Although only one polysilicon thin film resistor has been shown in FIG. 7 and FIG. 8 for the sake of simplicity, the actual resistance circuit region is formed of a plurality of polysilicon thin film resistors.

Figure 9:
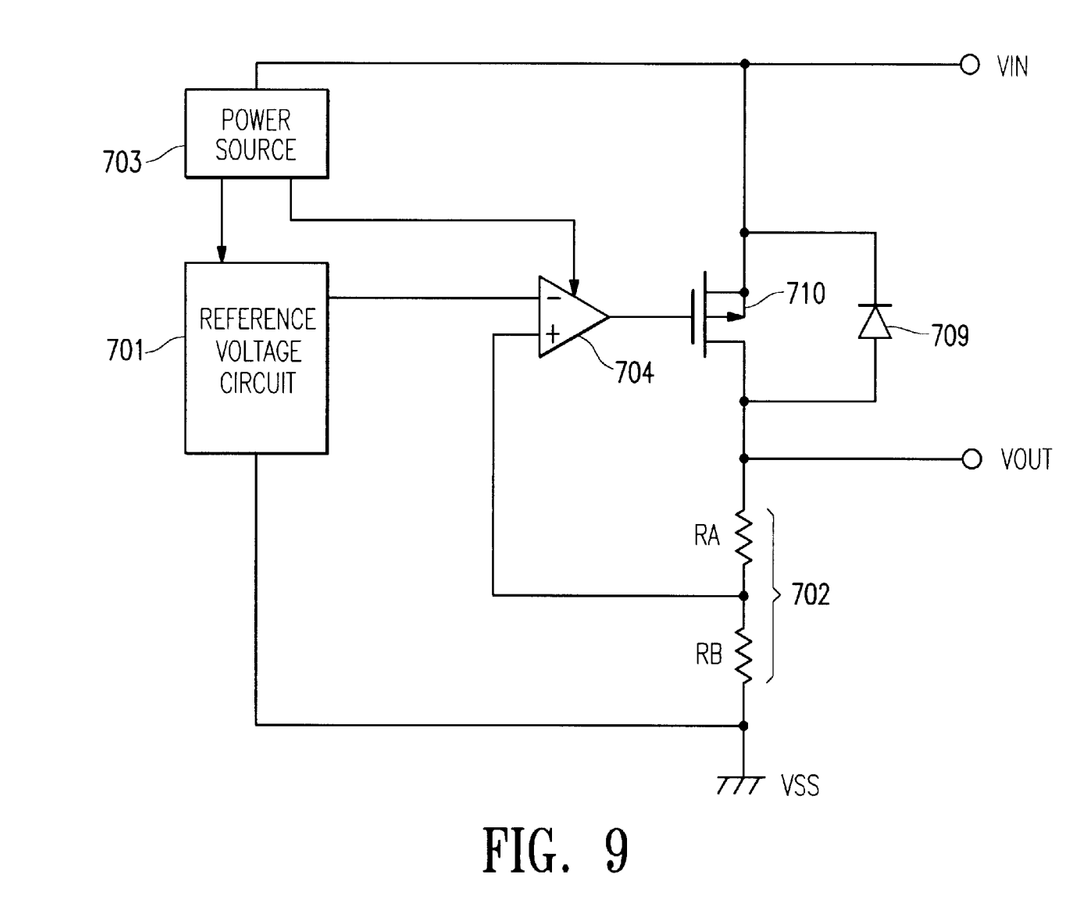
FIG. 9 is a block diagram showing an embodiment of a voltage detector using a bleeder resistance circuit according to the present invention.

FIG. 9 is a block diagram showing an embodiment of a voltage detector using a bleeder resistance circuit according to the present invention.

An example of a simple circuit has been shown for the same of simplicity, but functions may be added to actual products as occasion demands.

Basic circuit components of the voltage detector are a current source 703, a reference voltage circuit 701, a bleeder resistance circuit 702 and an error amplifier 704, and an inverter 706, N-type transistors 705 and 708, a P-type transistor 707 and so on are added in addition to the above. A part of operation will be briefly described hereinafter.

When VDD is predetermined canceling voltage or higher, the N-type transistors 705 and 708 are turned OFF, and the P-type transistor 707 is turned ON, and VDD is outputted at an output OUT. The input voltage of the error amplifier 704 at this time becomes (RB+RC)/(RA+RB+RC)*VDD.

When VDD is lowered and reaches detection voltage or lower, VSS is outputted to the output OUT. At this time, the N-type transistor 705 is in an ON state, and the input voltage of the error amplifier 704 becomes R B/(RA+RB)*VDD.

As described, the basic operation is performed by comparing reference voltage generated in the reference voltage circuit 701 with the voltage divided in the bleeder resistance circuit 702 by the error amplifier 704. Thus, the accuracy of the voltage divided in the bleeder resistance circuit 702 becomes extremely important. If the voltage division accuracy of the bleeder resistance circuit 702 is low, the input voltage to the error amplifier 704 fluctuates, and predetermined canceling or detection voltage becomes no longer obtainable. Since highly accurate voltage division becomes possible by using the bleeder resistance circuit according to the present invention, it becomes possible to improve product yield as ICs and to manufacture more highly accurate voltage detectors. Further, the resistance value of the whole bleeder resistance circuit 702 is made high at one mega-ohm or higher in many cases in order to control current consumption of the IC. At this time, since resistors each having a very slender shape are combined in the structure for the purpose of maintaining fixed accuracy, a wide area is required. It is not seldom in a voltage detector that even half or more of the whole IC chip area is occupied by the bleeder resistance circuit. The bleeder resistance circuit according to the present invention can obtain constant accuracy with a short configuration since dispersion of resistance values of respective resistors is small. Therefore, it is possible to make the occupied area of the bleeder resistance circuit smaller, which contributes greatly to area reduction of the whole IC chip.

Figure 10:
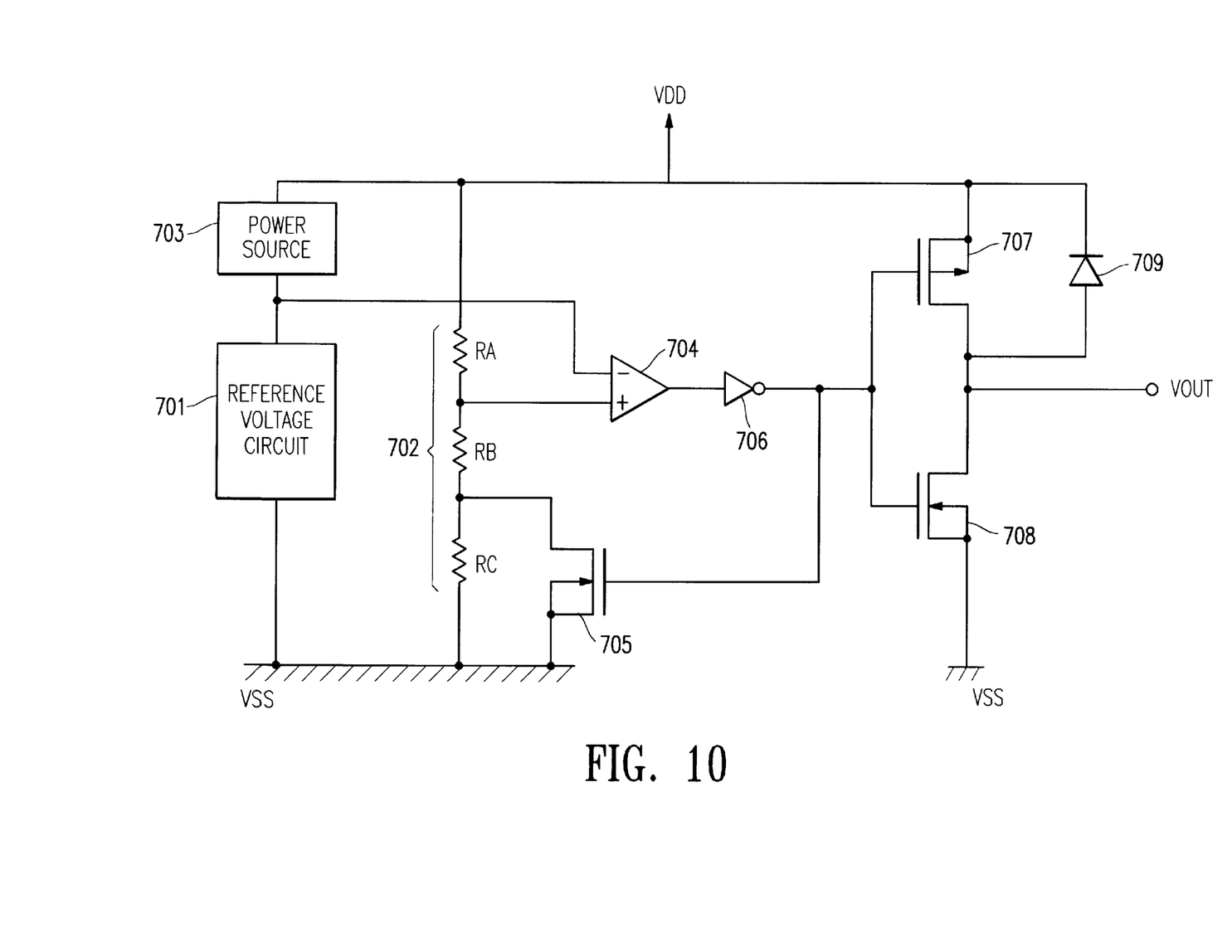
FIG. 10 is a block diagram showing an embodiment of a voltage regulator using a bleeder resistance circuit according to the present invention.

FIG. 10 is a block diagram showing an embodiment of a voltage regulator using a bleeder resistance circuit according to the present invention.

Although an example of a simple circuit is shown for the sake of simplicity, functions may be added to actual products as occasion demands.

Basic circuit components of the voltage regulator are a current source 703, a reference voltage circuit 701, a bleeder resistance circuit 702, an error amplifier 704, a P-type transistor 710 operating as a current control transistor and so on. A part of the operation will be described briefly hereinafter.

The error amplifier 704 compares the voltage dividend by the bleeder resistance circuit 702 with the reference voltage generated in the reference voltage circuit 701, and supplies gate voltage required for obtaining fixed output voltage VOUT which is not subject to the influence of input voltage VIN and temperature change to the P-type transistor 710. In the voltage regulator, the basic operation is performed by comparing the reference voltage generated in the reference voltage circuit 701 with the voltage divided in the bleeder resistance circuit 702 by the error amplifier 704 similarly to the case of the voltage detector described in FIG. 9. Thus, the accuracy of the voltage divided in the bleeder resistance circuit 702 becomes very important. When the voltage division accuracy of the bleeder resistance circuit 702 is low, the input voltage to the error amplifier 704 disperses and predetermined output voltage VOUT becomes no longer obtainable. Since highly accurate voltage division becomes possible by using a bleeder resistance circuit according to the present invention, product yield as ICs is improved, and it becomes possible to manufacture more highly accurate voltage regulators.

Next, a method of manufacturing a semiconductor device according to the present invention will be described with reference to FIG. 11 and FIG. 12.

FIGS. 11(a) to (f) are typical sectional views showing a method of manufacturing a semiconductor device according to the present invention.

Figure 11A:
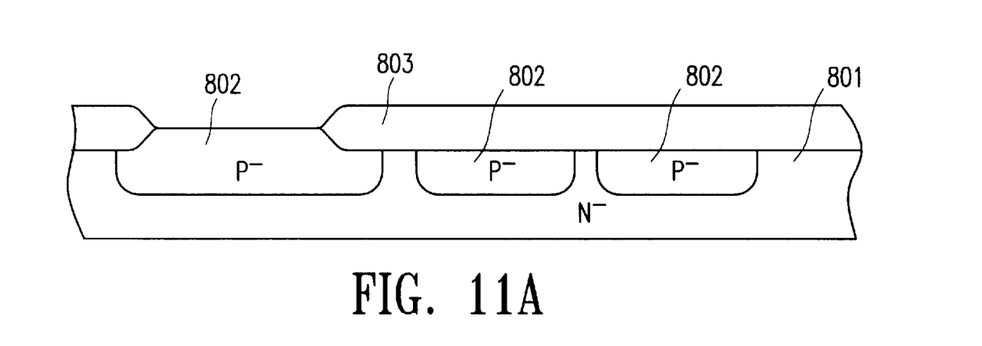
FIG. 11 is a typical sectional view showing an embodiment of a method of manufacturing a semiconductor device according to the present invention.
Figure 11B:
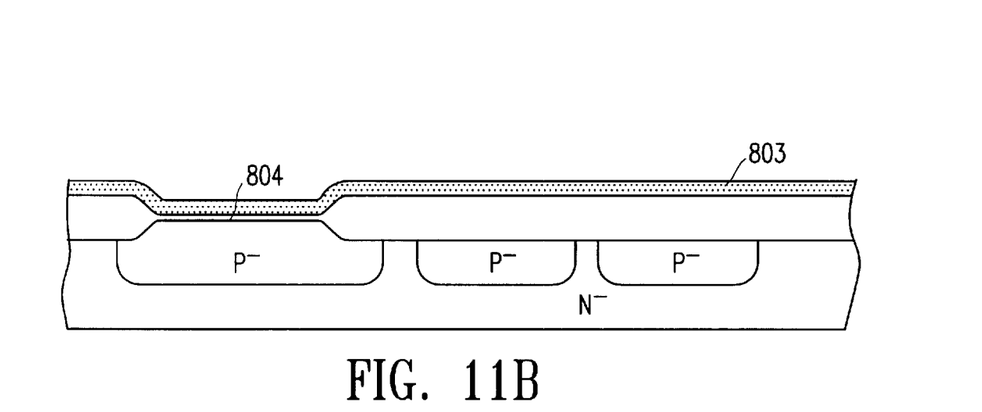
Figure 11C:
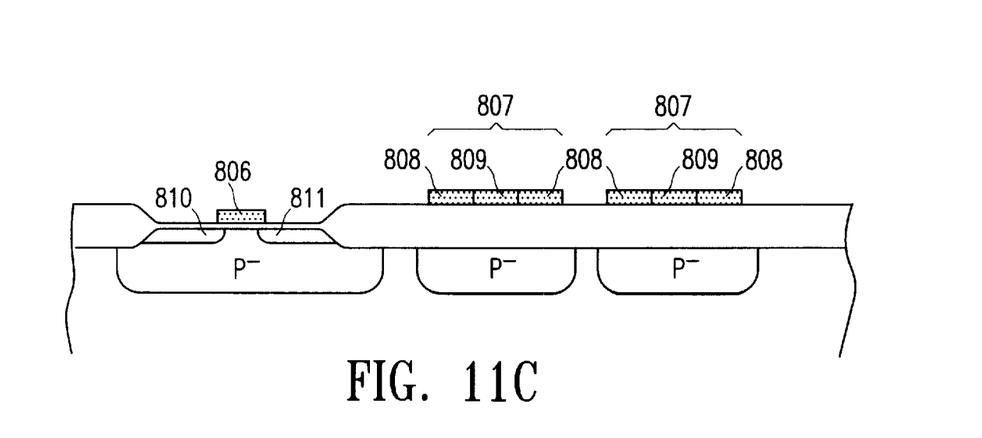
Figure 11D:
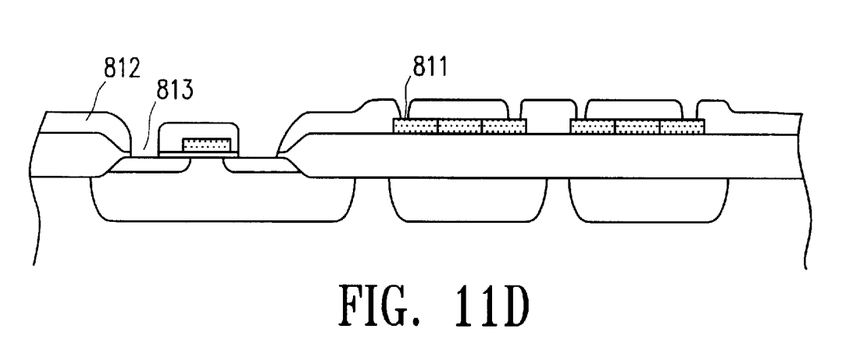
Figure 11E:
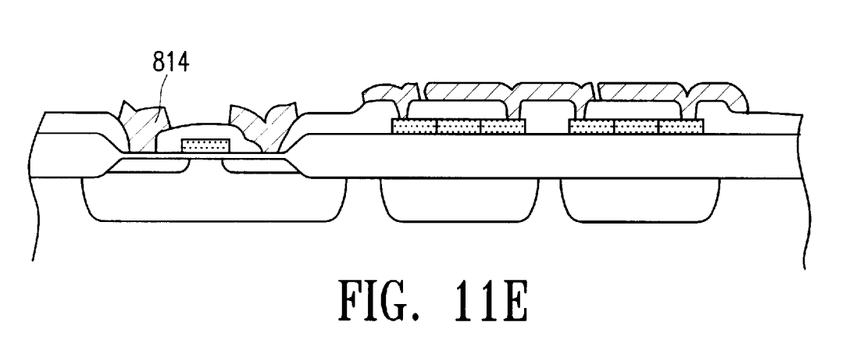
Figure 11F:
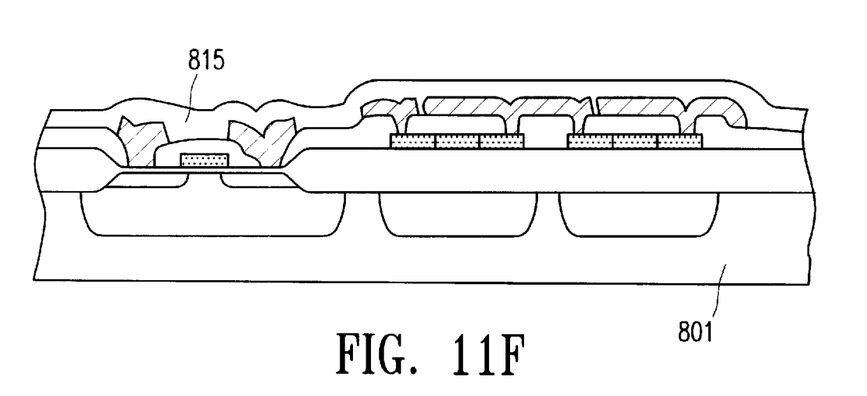

In FIG. 11(a), a thin N-type silicon substrate 801 is prepared, P-type impurities are introduced selectively by an ion implantation method, and heat treatment is applied thereafter so as to form separated independent P-well regions 802. The surface concentration of the P-well region 802 is approximately 1E16 atoms/cm$^3$. Then, a field oxide film 803 having a thickness of approximately 8,000 Å is formed selectively by a LOCOS method. Next, as shown in FIG. 11(b), after a gate oxide film 804 is formed, channel doping for predetermined threshold control is performed, and a polysilicon layer 805 is deposited in a thickness of approximately 4,000 Å by a CVD method and impurities such as phosphorus are introduced by an ion implantation method so as to obtain a predetermined sheet resistance value. Next, as shown in FIG. 11(c), after impurities such as phosphorus of high concentration are introduced selectively so that a predetermined region of the polysilicon layer 805 shows low resistance, etching is made in a predetermined configuration so as to form polysilicon resistors 807 each having a high resistance region 809 put between a gate electrode 806 and low resistance region 808. Respective polysilicon resistors 807 are arranged so as to interface with P-well regions 802 formed in a previous process. Then, N-type impurities such as phosphorus are introduced by an ion implantation method, thereby to form a source region 810 and a drain region 811 of an N-type transistor. Here, although a P-type transistor is not illustrated, P-type impurities such as boron are introduced by an ion implantation method similarly to the N-type transistor, thereby to form a source region and a drain region of a transistor. Next, as shown in FIG. 11(d), an intermediate insulating film 812 composed of PSG, NSG or the like is deposited in a thickness of approximately 8,000 Å, and then a contact hole 813 is formed. Next, as shown in FIG. 11(e), an aluminum layer 814 having a thickness of approximately one micron that becomes a wiring is deposited by a sputtering method, and is patterned into a predetermined configuration. At this time, aluminum layers 814 connected to low resistance regions 808 at one end of respective polysilicon resistors 807 are arranged on respective polysilicon resistors 807. Further, although it is not illustrated, the aluminum layers 814 are also connected to P-well regions 802 arranged under respective polysilicon resistors 807 through the field oxide film 803. Next, as shown in FIG. 11(f), a protective film 815 having a thickness of approximately 8,000 Å composed of a silicon nitride film is formed. Then, although it is not illustrated, the protective film 815 at a region such as a bonding pad is removed. With the process described above, a semiconductor device having polysilicon resistors according to the present invention is completed.

FIGS. 12(a) to (f) are typical sectional views showing another embodiment of a method of manufacturing a semiconductor device according to the present invention.

Figure 12A:
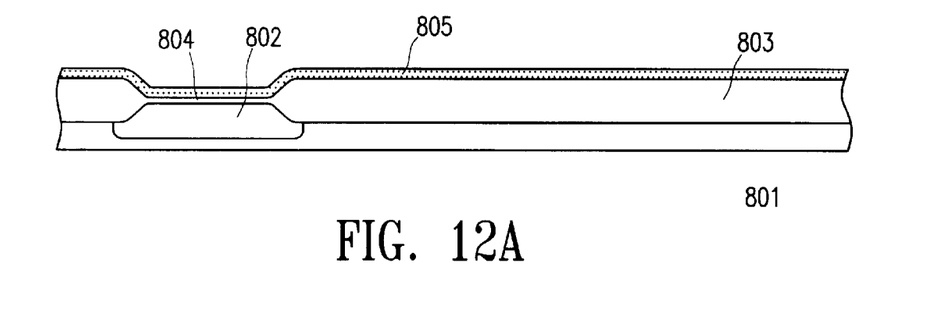
FIG. 12 is a typical sectional view showing another embodiment of a method of manufacturing a semiconductor device according to the present invention.
Figure 12B:
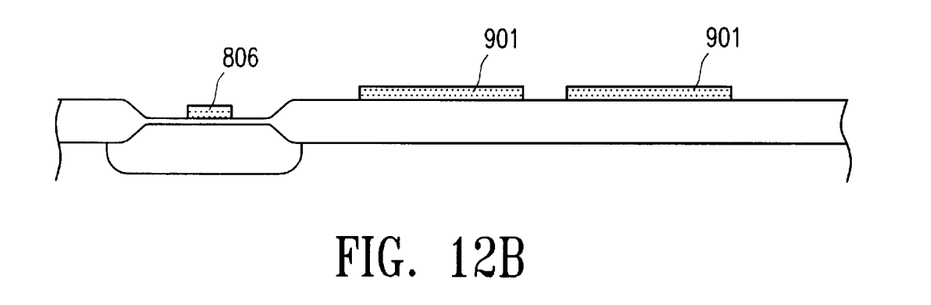
Figure 12C:
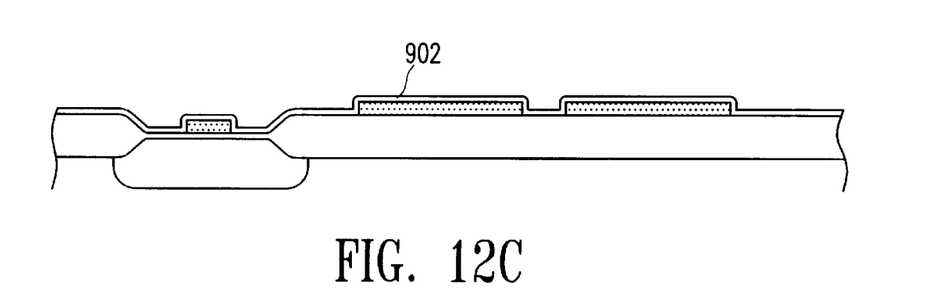
Figure 12D:
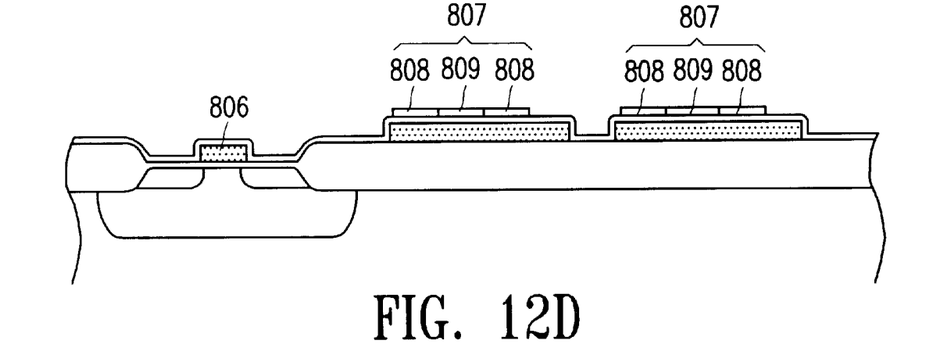
Figure 12E:
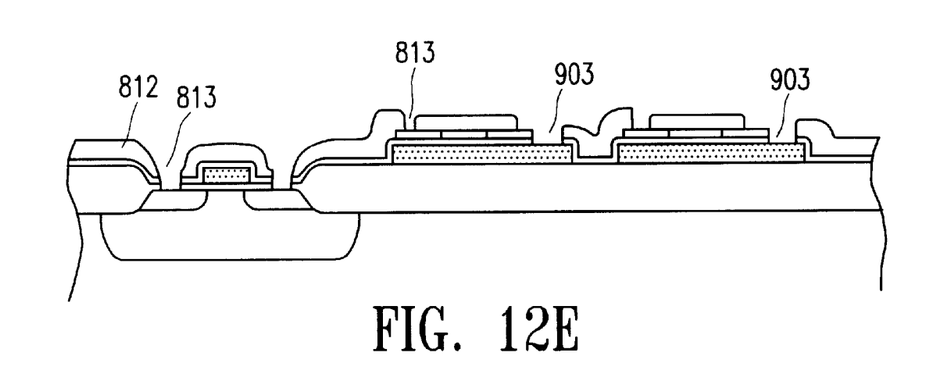
Figure 12F:
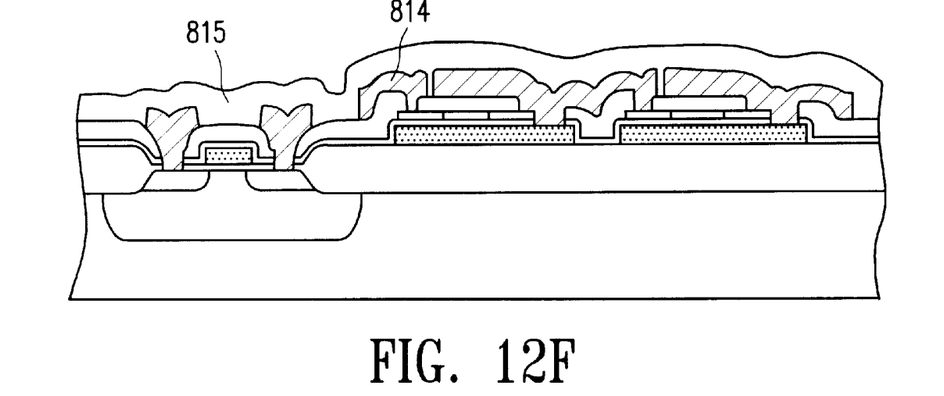

In FIG. 12(a), a thin N-type silicon substrate 801 is prepared, P-type impurities are introduced selectively by an ion implantation method, and heat treatment is applied thereafter so as to form a separated independent P-well region 802. The surface concentration of the P-well region 802 is approximately 1E16 atoms/cm$^3$. Being different from the example described in FIG. 11, it is not necessarily required to form the P-well region 802 in a region where the polysilicon resistor is formed later. Next, a field oxide film 803 having a thickness of approximately 8,000 Å is formed selectively by a LOCOS method. Next, after a gate oxide film 804 is formed, channel doping for predetermined threshold control is performed, and a polysilicon layer 805 is deposited in a thickness of approximately 4,000 Å by a CVD method. Then, impurities such as phosphorus of high concentration are introduced so that the polysilicon layer 805 shows low resistance. Next, as shown in FIG. 12(b), the polysilicon layer 805 is etched into a predetermined configuration so as to form a gate electrode 806 of low resistance and low resistance polysilicon layers 901. Next, as shown in FIG. 12(c), a first insulating film 902 is formed by a thermal oxidation method or a CVD method. The first insulating film 902 is composed of a multilayer film containing a silicon oxide film or a silicon nitride film. Next, as shown in FIG. 12(d), polysilicon is deposited in a thickness of 800 Å and impurities such as phosphorus are introduced by an ion implantation method so as to obtain a predetermined sheet resistance value. Then, after patterning is applied into a predetermined configuration, N-type impurities such as phosphorus are introduced by an ion implantation method so as to form low resistance regions 808 and a source region 810 and a drain region 811 of N-type transistor are formed at the same time. Thus, the polysilicon resistors 807 each having a high resistance region 809 put between low resistance regions 808 is completed. Here, respective polysilicon resistors 807 are formed on dependent low resistance polysilicon layers 901 through the first insulating film 902. Further, although a P-type transistor region is not illustrated, P-type impurities such as boron are introduced by an ion implantation method similarly to the N-type transistor, thereby to form a source region and a drain region of a transistor. Next, as shown in FIG. 12(e), an intermediate insulating film 812 composed of PSG, NSG or the like is deposited in a thickness of approximately 8,000 Å, and then, a contact hole 813 is formed. At this time, it is arranged so that the low resistance regions 808 of the polysilicon resistors 807 and the low resistance polysilicon layers 901 may be connected through contact holes 903. Next, as shown in FIG. 12(f), an aluminum layer 814 having a thickness of approximately one micron which becomes wiring is deposited by a sputtering method, and is patterned into a predetermined configuration. At this time, the aluminum layer 814 connected low resistance regions 808 at one end of respective polysilicon resistors 807 with low resistance polysilcon layers 901 arranged thereunder through the first insulating film 902 through common contact holes 903 is arranged on respective polysilcon resistors 807. Next, a protective film 815 having a thickness of approximately 8,000 Å composed of a silicon nitride film is formed. Then, although it is not illustrated, the protective film 815 of a region such as a bonding pad is removed. With the process described above, a semiconductor device having polysilicon resistors according to the present invention is completed.

As described above, according to the present invention, the resistance value of respective polysilicon resistors is held correctly by making potentials of respective resistors themselves and electric conductors located thereabove and thereunder equal to each other. Thus, it is possible to realize a highly precise bleeder resistance circuit having an accurate voltage division ratio. It is possible to reduce the dispersion of the resistance value of respective polysilicon resistors and to realize a more precise bleeder resistance circuit by setting the film thickness of the polysilicon resistor to 2,000 Å or less. Further, it is possible to make the temperature coefficient of the resistance value smaller by thinning the film thickness of the polysilicon resistors in the bleeder resistance circuit. In particular, when the film thickness is set to 1,000 Å or less, it is possible to obtain a very small temperature coefficient such as 3,000 ppm/° C. or below at a sheet resistance value of approximately 10 kΩ/□. Therefore, there is such an effect that a bleeder resistance circuit which is able to guarantee high voltage division accuracy in a wide temperature range can be formed with an area smaller than the occupied area by a conventional method.

Since highly precise voltage division becomes possible in a voltage detector or a voltage regulator according to the present invention, product yield as ICs is improved, and more precise products can be produced. Further, the resistance value of the whole bleeder resistance circuit is made to have high resistance at one mega-ohm or higher in many cases in order to control current consumption of the IC. At this time, since resistors each having a very slender configuration are combined in the structure for the purpose of holding certain accuracy, a wide area is required. It is not seldom that half or more area of the whole IC chip area is occupied by a bleeder resistance circuit in a voltage detector. Since the dispersion of the resistance value of respective resistors is small in a bleeder resistance circuit according to the present invention, it is possible to obtain fixed accuracy with a short configuration. Thus, it is possible to reduce the occupied area by the bleeder resistance circuit, which largely contribute to area reduction of the whole IC chip.

By adopting a method of manufacturing a semiconductor device according to the present invention, there is such an effect that the above-mentioned semiconductor device can be formed without requiring special processes or substantial process increase.

What is claimed is:

1. A semiconductor design comprising:

a plurality of first electric conductors;

a first insulating film overlying said plurality of first electric conductors;

a plurality of polysilicon thin film resistors overlying said first insulating film, each of said resistors having two ends, and each of said resistors overlying a respective one of said first electric conductors, with said resistors being disposed along a line with said resistors being spaced from one another along the line and said two ends of each of said resistors being spaced apart along the line;

first conducting means connected to said ends of said resistors for connecting said resistors together in series; and a plurality of first connecting means conductively connecting each of said first electric conductors to one said end of the respective overlying one of said resistors so that each of said first electric conductors is at the same potential as the respective one of said resistors.

2. A semiconductor device according to claim 1 further comprising:

a second insulating film overlying said plurality of thin film resistors;

a plurality of second electric conductors formed on said second insulating film and each overlying a respective one of said resistors; and a plurality of second connecting means conductively connecting one end of each of said resistors to the respective overlying one of said second electric conductors so that each of said resistors is at the same potential as the respective overlying one of said second electric conductors.

3. A semiconductor device according to claim 2, wherein said thin film resistors are composed of polysilicon.

4. A semiconductor device according to claim 1 wherein said plurality of thin film resistors include first and second resistors, the two ends of each of said first and second resistors constitute first and second ends, respectively, said first end of said first resistor faces said second end of said second resistor, and each of said first connecting means connects a respective one of said first electric conductors to said first end of a respective one of said resistors.

5. A semiconductor device including:
- a plurality of polysilicon thin film resistors connected in series with each other with wires and providing a wiring at each end of it and formed on a semiconductor substrate through a first insulating film; and
- an insulating film formed on said plurality of thin polysilicon film resistors;
- a plurality of electric conductors formed in each said polysilicon thin film resistor respectively through said insulating film; and
- a plurality of connecting means for connecting each said wiring to said electric conductor at an upper part of said each polysilicon thin film resistor and at the same direction against said series direction respectively so as to have substantially the same potential.

6. A semiconductor device according to claim 5, wherein said thin film resistors are composed of polysilicon.

7. A semiconductor device according to claim 5 or 6, wherein the film thickness of said thin film resistor is several 10 to 2,000 angstrom.

8. A semiconductor device according to claim 5 or 6, wherein the film thickness of said thin film resistor is several 10 to 1,000 angstrom.

9. A semiconductor device according to claim 5 or 6, wherein said first electric conductor is composed of a well region formed in a silicon substrate.

10. A semiconductor device according to claim 5 or 6, wherein said first electric conductor is composed of polysilicon.

11. A semiconductor device according to claim 6, wherein said second electric conductor is composed of polysilicon.

12. A semiconductor device according to claim 6, wherein said second electric conductor is composed of aluminum.

13. A semiconductor device according to claim 6, wherein said first electric conductor is composed of a material forming a gate electrode of a MOS transistor formed on the same chip as said plurality of thin film resistors.

14. A semiconductor device according to claim 5 or 6, wherein potentials of each of said plurality of thin film resistors and said first electric conductor corresponding to them are fixed by a metal wiring material through a common contact hole.

15. A semiconductor device according to claim 5 or 6 having a bleeder resistance circuit using said plurality of thin film resistors and at least one MOS transistor, wherein the film thickness of said thin film resistor of said bleeder resistance circuit is formed thinner than the film thickness of the gate electrode of said MOS transistor.

16. A semiconductor device according to claim 15, wherein the film thickness of said thin film resistor is several 10 to 1,000 angstrom.

17. A semiconductor device according to claim 15, wherein temperature dependency of the resistance value of said thin film resistor is −3,000 ppm/° C. or lower.

18. A semiconductor device according to claim 5 or 6 having said thin film resistors, wherein said thin film resistor is composed of a low resistance region and a high resistance region having high impurity concentration for connecting to metal wiring, and the film thickness of said high resistance region is smaller as compared with said low resistance region.

19. A semiconductor device according to claim 18, wherein the film thickness of said high resistance region is several 10 to 1,000 angstrom and the film thickness of said low resistance region is 2,000 angstrom to 10,000 angstrom.

20. A semiconductor device according to claim 18, wherein said low resistance region and said high resistance region of said thin film resistor are formed on the same flat face.

21. A semiconductor device according to claim 18, wherein upper faces of said low resistance region and said high resistance region of said thin film resistor form the same flat face.

22. A semiconductor device according to claim 5 or 6, wherein said first insulating film and said second insulating film are composed of silicon oxide films.

23. A semiconductor device according to claim 5 or 6, wherein one of or both of said first insulating film and said second insulating film are composed of a multilayer film containing a silicon nitride film.

24. A semiconductor device according to claim 5 or 6, wherein the resistance value of the whole bleeder resistance circuit using said plurality of thin film resistors is 1 mega-ohm to 100 mega-ohm.

* * * * *